United States Patent
Han et al.

(10) Patent No.: US 11,985,859 B2
(45) Date of Patent: May 14, 2024

(54) DISPLAY PANEL AND METHOD FOR FABRICATING SAME

(71) Applicant: SHENZHEN CHINA STAR OPTOELECTRONICS SEMICONDUCTOR DISPLAY TECHNOLOGY CO., LTD., Guangdong (CN)

(72) Inventors: Baixiang Han, Shenzhen (CN); Kun Cao, Shenzhen (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 618 days.

(21) Appl. No.: 16/615,474

(22) PCT Filed: Sep. 20, 2019

(86) PCT No.: PCT/CN2019/106924
§ 371 (c)(1),
(2) Date: Jan. 28, 2021

(87) PCT Pub. No.: WO2021/012374
PCT Pub. Date: Jan. 28, 2021

(65) Prior Publication Data
US 2021/0335957 A1    Oct. 28, 2021

(30) Foreign Application Priority Data

Jul. 22, 2019  (CN) .......................... 201910658902.7

(51) Int. Cl.
*H10K 59/121* (2023.01)
*H01L 21/02* (2006.01)
(Continued)

(52) U.S. Cl.
CPC ..... *H10K 59/1216* (2023.02); *H10K 59/1213* (2023.02); *H10K 59/122* (2023.02);
(Continued)

(58) Field of Classification Search
CPC ........... H10K 59/1216; H10K 59/1213; H10K 59/122; H10K 59/124; H10K 71/00;
(Continued)

(56) References Cited

U.S. PATENT DOCUMENTS

| 10,068,529 B2 | 9/2018 | Hekmatshoartabari et al. |
| 2006/0267491 A1* | 11/2006 | Koo ................... H10K 59/1216 313/511 |
| 2019/0123121 A1* | 4/2019 | Liu .................... H10K 59/1213 |

FOREIGN PATENT DOCUMENTS

| CN | 108091673 A | 5/2018 |
| CN | 108191673 A | 6/2018 |

(Continued)

*Primary Examiner* — Douglas W Owens
(74) *Attorney, Agent, or Firm* — BENESCH, FRIEDLANDER, COPLAN & ARONOFF LLP

(57) ABSTRACT

The present disclosure provides a display panel and a method for fabricating the same. The display panel includes a light transmitting area for disposing an organic light emitting unit and a storage area for disposing a storage capacitor. A location of the light transmitting area corresponds to a location of the storage area. The storage capacitor includes a first electrode plate and a second electrode plate which are composed of a transparent material.

19 Claims, 3 Drawing Sheets

(51) Int. Cl.
  *H01L 27/12* (2006.01)
  *H01L 29/66* (2006.01)
  *H01L 29/786* (2006.01)
  *H10K 59/12* (2023.01)
  *H10K 59/122* (2023.01)
  *H10K 59/124* (2023.01)
  *H10K 71/00* (2023.01)

(52) U.S. Cl.
  CPC ........... *H10K 59/124* (2023.02); *H10K 71/00* (2023.02); *H01L 21/02565* (2013.01); *H01L 27/1225* (2013.01); *H01L 27/1255* (2013.01); *H01L 27/127* (2013.01); *H01L 29/66969* (2013.01); *H01L 29/7869* (2013.01); *H10K 59/1201* (2023.02)

(58) Field of Classification Search
  CPC ............. H10K 59/1201; H10K 50/813; H10K 59/123; H10K 59/1315; H01L 21/02565; H01L 27/1225; H01L 27/1255; H01L 27/127; H01L 29/66969; H01L 29/7869
  See application file for complete search history.

(56) References Cited

FOREIGN PATENT DOCUMENTS

| | | | |
|---|---|---|---|
| CN | 109119440 A | 1/2019 | |
| CN | 109166895 A | 1/2019 | |
| CN | 109473461 A | 3/2019 | |
| CN | 109585520 A | 4/2019 | |
| CN | 09920923 A | 6/2019 | |
| CN | 109920923 A * | 6/2019 | ............. H01L 21/77 |

* cited by examiner

DISPLAY PANEL AND METHOD FOR FABRICATING SAME

FIELD OF INVENTION

The present disclosure relates to a field of display technology, and particularly to a display panel and a method for fabricating the same.

BACKGROUND

A current display panel typically comprises a light transmitting area and a storage area. The light transmitting area is used for disposing an organic light emitting unit comprising an organic light emitting layer. The storage area is used for disposing a storage capacitor used to store charge.

A current storage capacitor is made of a metal layer for making a gate and a metal layer for making a source/drain electrode. In order not to affect aperture ratio, it is necessary to avoid a light transmitting area. Therefore, an area occupied by pixels is increased, and a utilization rate of a display panel is reduced.

Therefore, it is necessary to provide a display panel and a method for fabricating the same to solve the problems in the prior art.

SUMMARY OF DISCLOSURE

An object of the present disclosure is to provide a display panel and a method for fabricating the same that can reduce an area occupied by pixels and improve a utilization rate of the display panel.

In order to solve the aforementioned technical problem, the present disclosure provides a display panel comprising:
a light transmitting area for disposing an organic light emitting unit; and
a storage area for disposing a storage capacitor;
wherein a location of the light transmitting area corresponds to a location of the storage area, and the storage capacitor comprises a first electrode plate and a second electrode plate which are composed of a transparent material.

The present disclosure further provides a method for fabricating a display panel, comprising:
providing a base substrate;
forming a transparent film on the base substrate;
patterning the transparent film to form an active layer and an electrode portion;
metalizing the electrode portion to form a first electrode plate;
forming a flat layer above the active layer and the first electrode plate, wherein the flat layer is provided with an open area, and a location of the open area corresponds to a position of the first electrode plate;
forming an anode layer on the flat layer and in the open area, wherein the anode layer in the open area is used as a second electrode plate;
forming a pixel defining layer on the anode layer, wherein the pixel defining layer is provided with a pixel defining area, and a location of the pixel defining area corresponds to the location of the open area;
forming an organic light emitting layer in the pixel defining area; and
forming a cathode layer on the organic light emitting layer.

The present disclosure provides a display panel and a method for fabricating the same. The display panel comprises a light transmitting area for disposing an organic light emitting unit and a storage area for disposing a storage capacitor. A location of the light transmitting area corresponds to a location of the storage area. The storage capacitor comprises a first electrode plate and a second electrode plate which are composed of a transparent material. Therefore, aperture ratio is not reduced. Furthermore, because the location of the light transmitting area corresponds to the location of the storage area, an area occupied by pixels is reduced. Therefore, a utilization rate of the display panel is improved.

DETAILED DESCRIPTION

Figure 1:
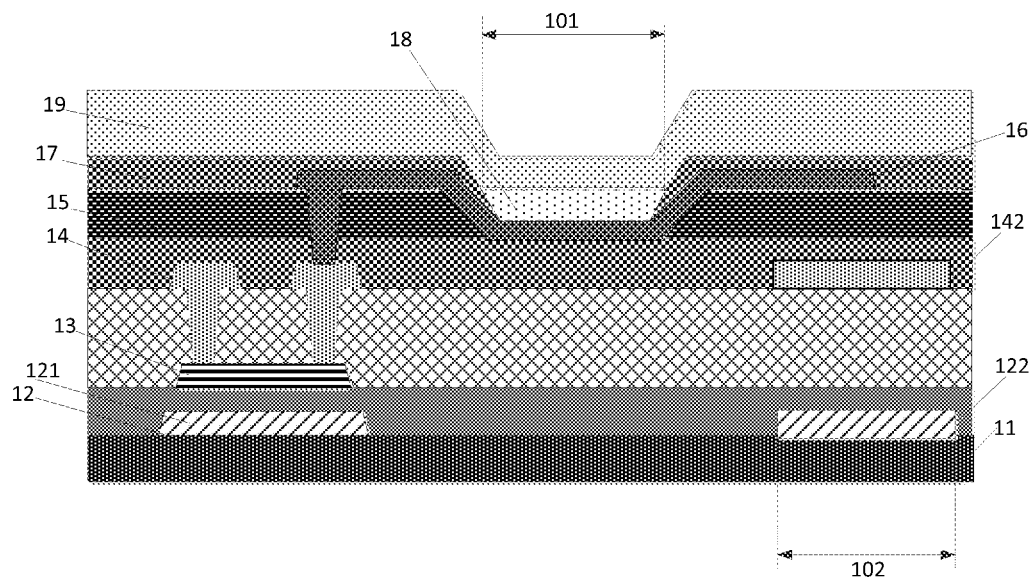
FIG. 1 is a cross-sectional side view of a current display panel.

The following description of various embodiments of the present disclosure with reference to the accompanying drawings is used to illustrate specific embodiments that can be practiced. Directional terms mentioned in the present disclosure, such as "above", "below", "front", "rear", "left", "right", "inside", "outside", "side", are merely used to indicate the direction of the accompanying drawings. Therefore, the directional terms are used for illustrating and understanding the present disclosure rather than limiting the present disclosure. In the figures, elements with similar structure are indicated by the same reference numerals.

As shown in FIG. 1, a current display panel comprises a light transmitting area 101 and a storage area 102. A cross-sectional structure of the current display panel comprises a base substrate 11, a first metal layer 12, an active layer 13, a second metal layer 14, a flat layer 15, an anode layer 16, a pixel defining layer 17, an organic light emitting layer 18, and a cathode layer 19. The first metal layer 12 comprises a gate electrode 121 and a first electrode plate 122. The second metal layer 14 comprises a source electrode, a drain electrode, and a second electrode plate 142. The pixel defining layer 17 is provided with a pixel defining area. The organic light emitting layer 18 is disposed in the pixel defining area. The cathode layer 19 is disposed on the organic light emitting layer 18.

Figure 2:
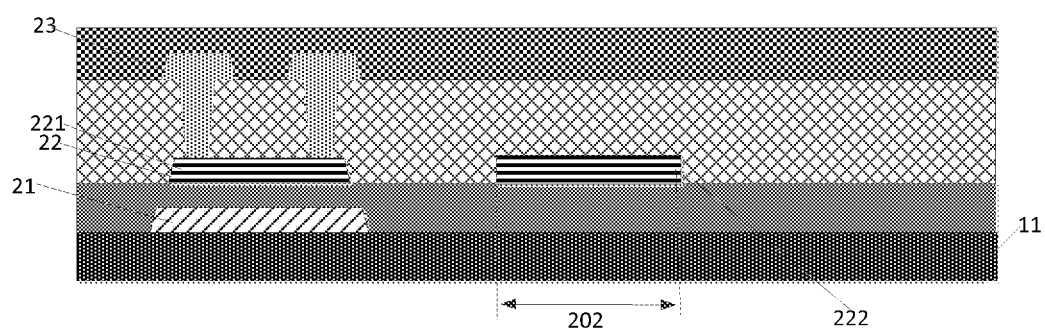
FIG. 2 is a cross-sectional side view of a structure formed by a first step and a second step of a method for fabricating a display panel according to the present disclosure.

Please refer to FIG. 2-5. FIG. 2 is a cross-sectional side view of a structure formed by a first step and a second step of a method for fabricating a display panel according to the present disclosure.

In an embodiment, a method for fabricating a display panel according to the present disclosure comprises following steps.

S101: providing a base substrate, forming a transparent film on the base substrate, and patterning the transparent film to form an active layer and an electrode portion.

As shown in FIG. 2, a base substrate 11 is provided. A transparent film 22 is formed on the base substrate 11. The transparent film 22 is patterned to form an active layer 221 and an electrode portion. The method may further comprise: forming a first metal layer on the base substrate 11, patterning the first metal layer to form a gate electrode 21. The active layer 221 is formed on the gate electrode 21.

The active layer is composed of a transparent metal oxide. Preferably, the active layer is composed of indium gallium zinc oxide.

S102: metalizing the electrode portion to form a first electrode plate.

As shown in FIG. 2, the electrode portion is metalized to form a first electrode plate 222.

The method may further comprise: forming a second metal layer 23 on the active layer 221 and patterning the second metal layer 23 to form a source electrode and a drain electrode.

S103: forming a flat layer above the active layer and the first electrode plate, wherein the flat layer is provided with an open area.

Figure 3:
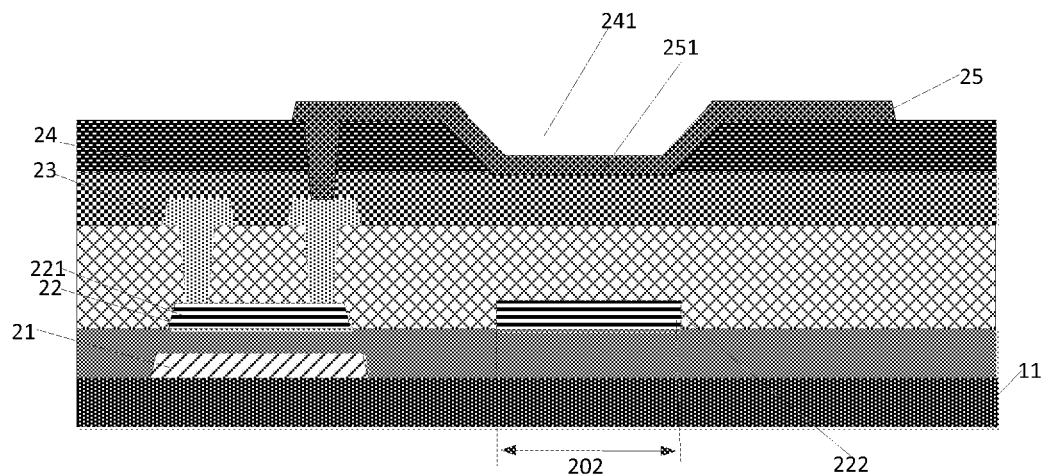
FIG. 3 is a cross-sectional side view of a structure formed by a third step and a fourth step of a method for fabricating a display panel according to the present disclosure.

As shown in FIG. 3, a flat layer 24 is formed above the second metal layer 23. The flat layer 24 is provided with an open area 241. A location of the open area 241 corresponds to a position of the first electrode plate 222.

S104: forming an anode layer on the flat layer and in the open area, wherein the anode layer in the open area is used as a second electrode plate.

As shown in FIG. 3, an anode layer 25 is formed on the flat layer 24 and in the open area 241. The anode layer 25 in the open area 241 is used as a second electrode plate 251. The flat layer 24 is further provided with a via hole, and the anode layer 25 is connected to the drain electrode through the via hole.

S105: forming a pixel defining layer on the anode layer, wherein the pixel defining layer is provided with a pixel defining area.

Figure 4:
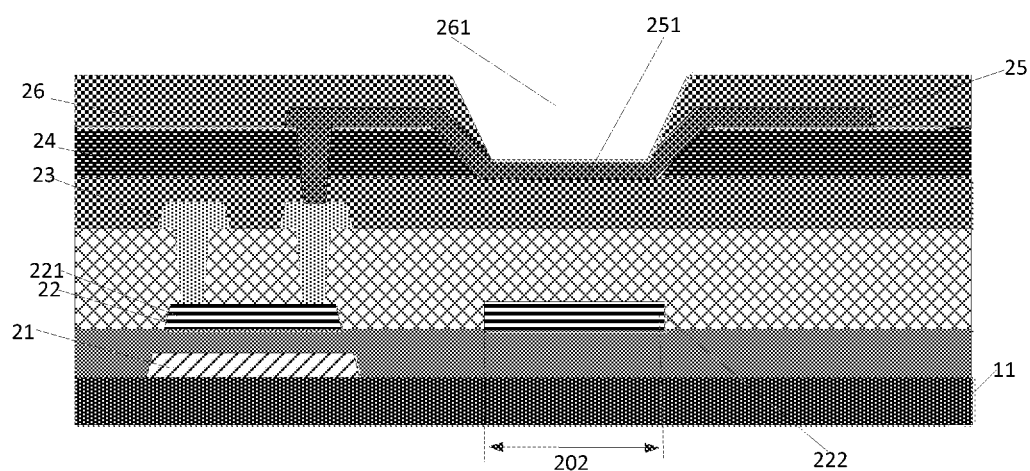
FIG. 4 is a cross-sectional side view of a structure formed by a fifth step of a method for fabricating a display panel according to the present disclosure.

As shown in FIG. 4, a pixel defining layer 26 is formed on the anode layer 25. The pixel defining layer 26 is provided with a pixel defining area 261. A location of the pixel defining area 261 corresponds to the location of the open area 241. The pixel defining layer 26 does not cover a bottom of the open area 241

S106: forming an organic light emitting layer in the pixel defining area.

Figure 5:
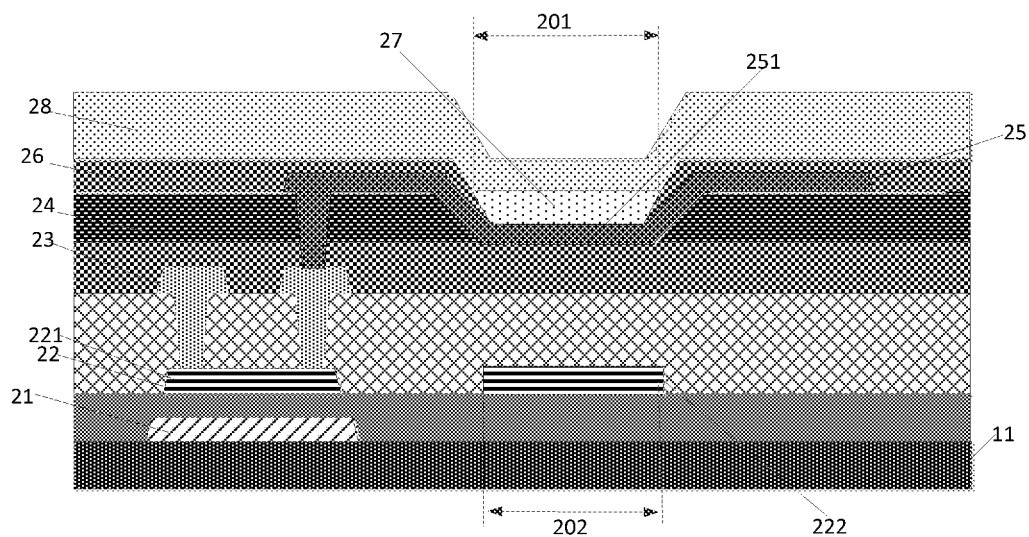
FIG. 5 is a cross-sectional side view of a structure formed by a sixth step and a seventh step of a method for fabricating a display panel according to the present disclosure.

Please refer to FIG. 4 and FIG. 5, an organic light emitting layer 27 is formed in the pixel defining area 261.

S107: forming a cathode layer on the organic light emitting layer.

As shown in FIG. 5, a cathode layer 28 is formed on the organic light emitting layer 27.

As shown in FIG. 5, the present disclosure further provides a display panel comprising a light transmitting area 201 and a storage area 202. The light transmitting area 201 is used for disposing an organic light emitting unit. A cross-sectional structure of the organic light emitting unit comprises an anode electrode, an organic light emitting layer 27, and a cathode electrode.

The storage area 202 is used for disposing a storage capacitor. A location of the light transmitting area 201 corresponds to a location of the storage area 202. The storage capacitor comprises a first electrode plate 222 and a second electrode plate 251 which are composed of a transparent material.

In an embodiment, a cross-sectional structure of the display panel comprises a base substrate 11, a first metal layer, an active layer 221, a second metal layer 23, a flat layer 24, an anode layer 25, a pixel defining layer 26, an organic light emitting layer 27, and a cathode layer 28.

The first metal layer is disposed on the base substrate 11. The first metal layer comprises a gate electrode 21. The active layer 221 is disposed on the first metal layer. The first electrode plate 222 is in the same layer as the active layer 221. The first electrode plate 222 may be in another layer. In an embodiment, in order to simplify the process, an initial material of the first electrode plate 222 is the same as a material of the active layer 221, and the first electrode plate 222 is formed by metalizing the initial material of the first electrode plate 222. In an embodiment, the active layer 221 is composed of a transparent metal oxide. In an embodiment, the active layer 221 is composed of indium gallium zinc oxide. The first electrode plate 222 and the active layer 221 may be fabricated separately.

The second metal layer 23 is disposed on the active layer 221. The second metal layer 23 comprises a source electrode and a drain electrode.

Please refer to FIG. 3, the flat layer 24 is disposed on the second metal layer 23. The flat layer 24 is further provided with a via hole (not shown) and an open area 241. A location of the open area 241 corresponds to a location of the first electrode plate 222.

In an embodiment, the second electrode plate 251 is in the same layer as the anode layer 25. The second electrode plate 251 may be in another layer.

In order to simplify the process, the anode layer 25 is disposed on the flat layer 35 and in the open area 241. The second electrode plate 251 is the anode layer 25 in the open area 241. That is, the anode layer 25 in the open area 241 is used as the second electrode plate 251. The anode layer 25 is connected to the drain electrode through the via hole.

Please refer to FIG. 4, the pixel defining layer 26 is disposed on the anode layer 25. The pixel defining layer 26 is provided with a pixel defining area 261. A location of the pixel defining area 261 corresponds to the position of the open area 241.

The organic light emitting layer 27 is disposed in the pixel defining area 261. The cathode layer 28 is disposed on the organic light emitting layer 27. The display panel may further comprise an encapsulation layer disposed on the cathode layer 28.

It can be understood that a display panel according to the present disclosure can be produced by the above method, and can also be obtained by other methods.

Because that the location of the light transmitting area corresponds to the location of the storage area and that the first electrode plate and the second electrode plate are composed of a transparent material, an area occupied by pixels is reduced while aperture ratio is not reduced. Therefore, a utilization rate of the display panel is improved.

The present disclosure provides a display panel and a method for fabricating the same. The display panel comprises a light transmitting area for disposing an organic light emitting unit and a storage area for disposing a storage capacitor. A location of the light transmitting area corresponds to a location of the storage area. The storage capacitor comprises a first electrode plate and a second electrode plate which are composed of a transparent material. Therefore, aperture ratio is not reduced. Furthermore, because the location of the light transmitting area corresponds to the location of the storage area, an area occupied by pixels is reduced. Therefore, a utilization rate of the display panel is improved.

In the above, the present application has been described in the above preferred embodiments, but the preferred embodiments are not intended to limit the scope of the present application, and those skilled in the art may make various modifications without departing from the scope of the present application. The scope of the present application is determined by claims.

What is claimed is:

1. A display panel, comprising:
   a light transmitting area for disposing an organic light emitting unit; and
   a storage area for disposing a storage capacitor;
   wherein a location of the light transmitting area corresponds to a location of the storage area, and the storage capacitor comprises a first electrode plate and a second electrode plate which are composed of a transparent material; and
   wherein a cross-sectional structure of the display panel comprises an active layer and an anode layer, the first electrode plate is in the same layer as the active layer, and the second electrode plate is in the same layer as the anode layer.

2. The display panel according to claim 1, wherein the first electrode plate is formed by making a material same as a material of the active layer conductive.

3. The display panel according to claim 2, wherein the active layer is composed of a transparent metal oxide.

4. The display panel according to claim 3, wherein the active layer is composed of indium gallium zinc oxide.

5. The display panel according to claim 1, wherein the cross-sectional structure of the display panel further comprises a flat layer provided with an open area, a location of the open area corresponds to a location of the first electrode plate, the anode layer is disposed on the flat layer and in the open area, and the second electrode plate is the anode layer in the open area.

6. The display panel according to claim 5, wherein the cross-sectional structure of the display panel further comprises:
   a pixel defining layer disposed on the anode layer, wherein the pixel defining layer is provided with a pixel defining area, and a location of the pixel defining area corresponds to the position of the open area;
   an organic light emitting layer disposed in the pixel defining area; and
   a cathode layer disposed on the organic light-emitting layer.

7. The display panel according to claim 5, wherein the cross-sectional structure of the display panel further comprises a second metal layer comprising a source electrode and a drain electrode, the flat layer is further provided with a via hole, and the anode layer is connected to the drain electrode through the via hole.

8. The display panel according to claim 1, wherein the cross-sectional structure of the display panel further comprises a first metal layer comprising a gate electrode, the first metal layer is disposed below the active layer, and the first meta layer comprises a gate electrode.

9. A display panel, comprising:
   a light transmitting area for disposing an organic light emitting unit; and
   a storage area for disposing a storage capacitor;
   wherein a location of the light transmitting area corresponds to a location of the storage area, and the storage capacitor comprises a first electrode plate and a second electrode plate which are composed of a transparent material,
   wherein a cross-sectional structure of the display panel comprises an anode layer, and the second electrode plate is in the same layer as the anode layer.

10. The display panel according to claim 9, wherein a cross-sectional structure of the display panel comprises an active layer, and the first electrode plate is in the same layer as the active layer.

11. The display panel according to claim 10, wherein the first electrode plate is formed by making a material same as a material of the active layer conductive.

12. The display panel according to claim 11, wherein the active layer is composed of a transparent metal oxide.

13. The display panel according to claim 12, wherein the active layer is composed of indium gallium zinc oxide.

14. The display panel according to claim 9, wherein the cross-sectional structure of the display panel further comprises a flat layer provided with an open area, a location of the open area corresponds to a location of the first electrode plate, the anode layer is disposed on the flat layer and in the open area, and the second electrode plate is the anode layer in the open area.

15. The display panel according to claim 14, wherein the cross-sectional structure of the display panel further comprises:
   a pixel defining layer disposed on the anode layer, wherein the pixel defining layer is provided with a pixel defining area, and a location of the pixel defining area corresponds to the position of the open area;
   an organic light emitting layer disposed in the pixel defining area; and
   a cathode layer disposed on the organic light-emitting layer.

16. The display panel according to claim 15, wherein the cross-sectional structure of the display panel further comprises a second metal layer comprising a source electrode and a drain electrode, the flat layer is further provided with a via hole, and the anode layer is connected to the drain electrode through the via hole.

17. A method for fabricating a display panel, comprising:
   forming a transparent film on a base substrate;
   patterning the transparent film to form an active layer and an electrode portion;
   making the electrode portion conductive to form a first electrode plate;
   forming a flat layer above the active layer and the first electrode plate, wherein the flat layer is provided with an open area, and a location of the open area corresponds to a position of the first electrode plate;
   forming an anode layer on the flat layer and in the open area, wherein the anode layer in the open area is used as a second electrode plate;
   forming a pixel defining layer on the anode layer, wherein the pixel defining layer is provided with a pixel defining area, and a location of the pixel defining area corresponds to the location of the open area;
   forming an organic light emitting layer in the pixel defining area; and
   forming a cathode layer on the organic light emitting layer.

18. The method for fabricating a display panel according to claim 17, wherein the transparent film is composed of a transparent metal oxide.

19. The method for fabricating a display panel according to claim 17, wherein the transparent film is composed of indium gallium zinc oxide.

* * * * *